(12) United States Patent
Schmidt et al.

(10) Patent No.: US 7,255,466 B2
(45) Date of Patent: Aug. 14, 2007

(54) ILLUMINATED KEYLESS ENTRY CONTROL DEVICE

(75) Inventors: Robert M. Schmidt, Livonia, MI (US); David A. Hein, Sterling Heights, MI (US); Roberto Tomassi, Livonia, MI (US)

(73) Assignee: Lear Corporation, Southfield, MI (US)

( * ) Notice: Subject to any disclaimer, the term of this patent is extended or adjusted under 35 U.S.C. 154(b) by 136 days.

(21) Appl. No.: 11/131,161

(22) Filed: May 17, 2005

(65) Prior Publication Data

US 2006/0262549 A1 Nov. 23, 2006

(51) Int. Cl.
*B60Q 1/00* (2006.01)

(52) U.S. Cl. ............... 362/501; 362/800; 362/85; 362/394; 200/314

(58) Field of Classification Search ........ 362/501, 362/800; 400/472; 200/314
See application file for complete search history.

(56) References Cited

U.S. PATENT DOCUMENTS

| | | | |
|---|---|---|---|
| 6,854,870 B2 * | 2/2005 | Huizenga | 362/501 |
| 2004/0247363 A1 * | 12/2004 | Kaufman et al. | 400/472 |
| 2005/0275567 A1 * | 12/2005 | DePue et al. | 341/32 |

FOREIGN PATENT DOCUMENTS

| | | |
|---|---|---|
| EP | 0564066 | 10/1993 |
| EP | 0590550 | 4/1994 |
| EP | 1229647 | 8/2002 |
| GB | 2407650 | 5/2005 |
| GB | 2409523 | 6/2005 |

* cited by examiner

*Primary Examiner*—Renee Luebke
*Assistant Examiner*—Jessica L McMillan
(74) *Attorney, Agent, or Firm*—MacMillan, Sobanski & Todd, LLC

(57) ABSTRACT

A vehicular control device includes a trim member having a plurality of graphics for identifying a plurality of manual activation regions and a printed circuit board having a plurality of proximity sensors. Each of the plurality of proximity sensors generates a respective electromagnetic field within a respective manual activation region and is responsive to an object disposed in the respective manual activation region. The printed circuit board is semi-translucent and includes a plurality of illumination elements for illuminating light away from the printed circuit board. A back cover member is adaptable to the trim member for encasing the printed circuit board therebetween. A sealing member is disposed between the trim member and the back cover member. The illuminating light from the plurality of illumination elements is reflected toward the printed circuit board. The printed circuit board receives the illuminating light and diffuses the illuminating light therethrough for backlighting the plurality of graphics.

18 Claims, 4 Drawing Sheets

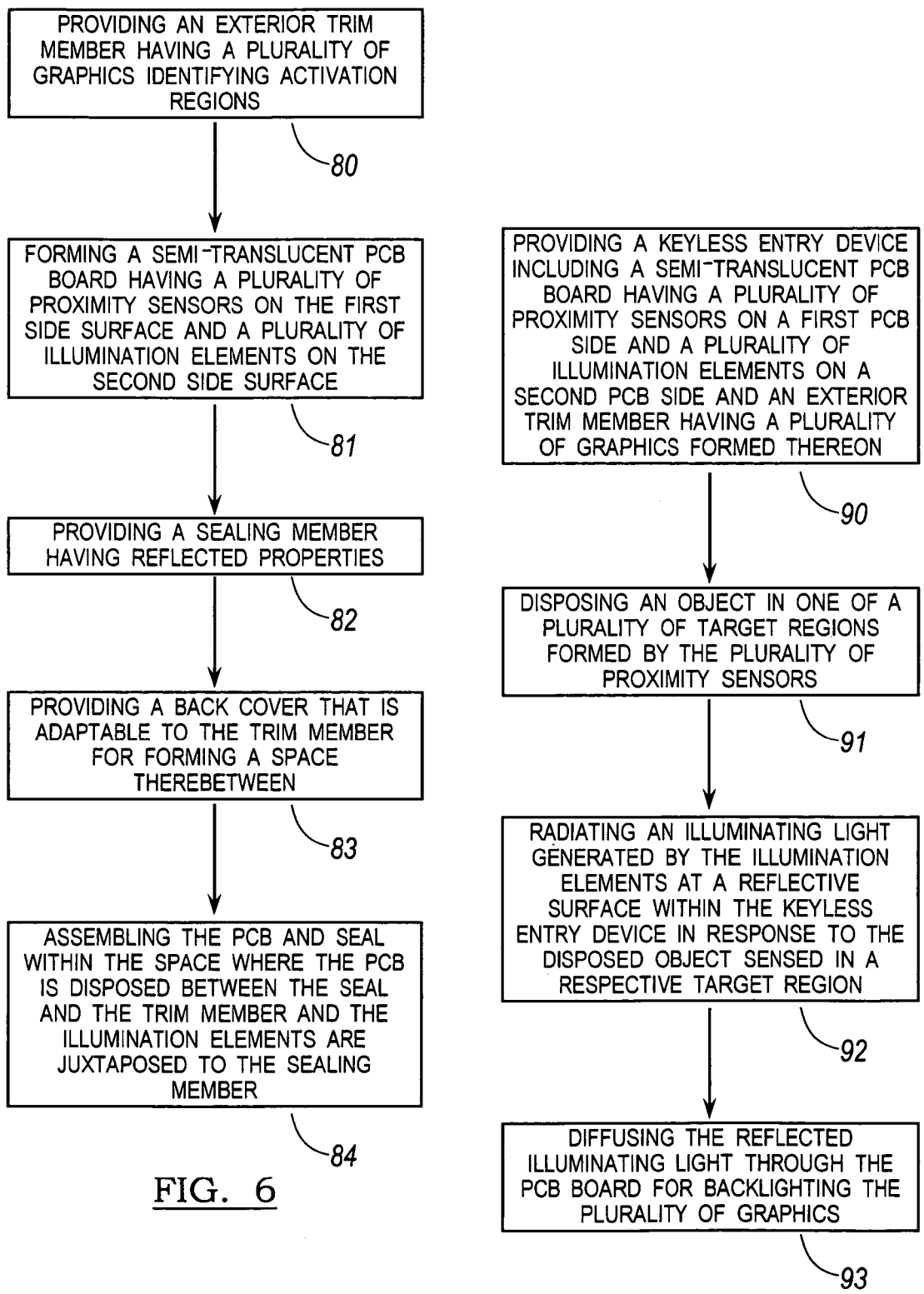

ILLUMINATED KEYLESS ENTRY CONTROL DEVICE

CROSS REFERENCE TO RELATED APPLICATIONS

Not Applicable.

STATEMENT REGARDING FEDERALLY SPONSORED RESEARCH 120

Not Applicable.

BACKGROUND OF THE INVENTION

1. Field of the Invention

The present invention relates in general to vehicular control devices, and more specifically, to a vehicular illuminated control device using touch switches.

2. Description of the Related Art

Vehicle door lock mechanisms include a plurality of devices for locking and unlocking a vehicle door. Such mechanical devices include a door lock stem and a vehicle door key. Other devices utilize an electronically controlled door lock actuator that engages the lock mechanism. The door lock actuator is electrically driven and is often controlled by a relay or an electronic control module. The electronic control module receives a locking or unlocking command via a wireline or a radio frequency (RF) signal from a user input control device.

One such user input control device includes a keyless entry pad typically mounted on a vehicle door or other vehicle panel. The keyless entry pad includes a plurality of buttons for transmitting a signal via a wireline to the electronic control module. The keyless entry touch pad further includes a plurality of graphics disposed on an exterior surface of each button. Each graphic identifies the location of a respective button. An exterior casing or weatherproof seals are used to conceal any gaps or openings between the bezel and buttons which assist in deterring contaminants or water from entering any of the gaps or openings. However such exterior casings or waterproof buttons require an additional cost to the vehicle manufacturers.

The graphical displays disposed on the exterior surface of each key or button are easily visible during the daylight, but they are not so easily visible during night hours in less ambient light. During the nighttime in poorly lit or no light conditions, the operator must have to either recall the location of the each button on the keyless entry touch pad or locate a respective touch pad switch and depress it for illuminating the keyless entry touch pad. The keyless entry pad is typically illuminated by direct lighting such as one or more LED's located below the exterior surface of the buttons directly focused at the graphics of the touch pad switch or by the use of lightpipes. Direct lighting often requires proper positioning and tight assembly tolerances for backlighting the graphics evenly. Lightpiping involves the added cost of incorporating lightpipes into the keyless entry device.

SUMMARY OF THE INVENTION

The present invention provides a method for operating an accessory device of a vehicle using a proximity sensing device. A plurality of proximity sensors detect an object in close proximity to the proximity sensing unit and determines an activation sequence between at least two proximity sensors for controlling the accessory device. The proximity sensors detect the presence of the object without having to actually depress a button or switch. Upon activation of at least one proximity sensor, illumination elements radiate illuminating light at a reflective surface. The illuminating light is then reflected by the reflective light and is then evenly diffused through a semi-translucent printed circuit board and is evenly diffused over a trim member having graphics disposed thereon.

In one aspect of the invention, a vehicular control device is provided that includes a trim member having a plurality of graphics for identifying a plurality of manual activation regions and a printed circuit board having a plurality of proximity sensors. Each of the plurality of proximity sensors generates a respective electromagnetic field within a respective manual activation region and is responsive to an object disposed in the respective manual activation region. The printed circuit board is semi-translucent and includes a plurality of illumination elements for illuminating light away from the printed circuit board. A back cover member is adaptable to the trim member for encasing the printed circuit board therebetween. A sealing member is disposed between the trim member and the back cover member. The illuminating light from the plurality of illumination elements is reflected toward the printed circuit board. The printed circuit board receives the illuminating light and diffuses the illuminating light therethrough for backlighting the plurality of graphics.

BRIEF DESCRIPTION OF THE DRAWINGS

FIG. 6 is a flowchart showing a method for forming the keyless door entry device according to a first preferred embodiment of the present invention.

FIG. 7 is a flowchart showing a method for operating the keyless door entry device according to a first preferred embodiment of the present invention.

DETAILED DESCRIPTION OF PREFERRED EMBODIMENTS

Figure 1:
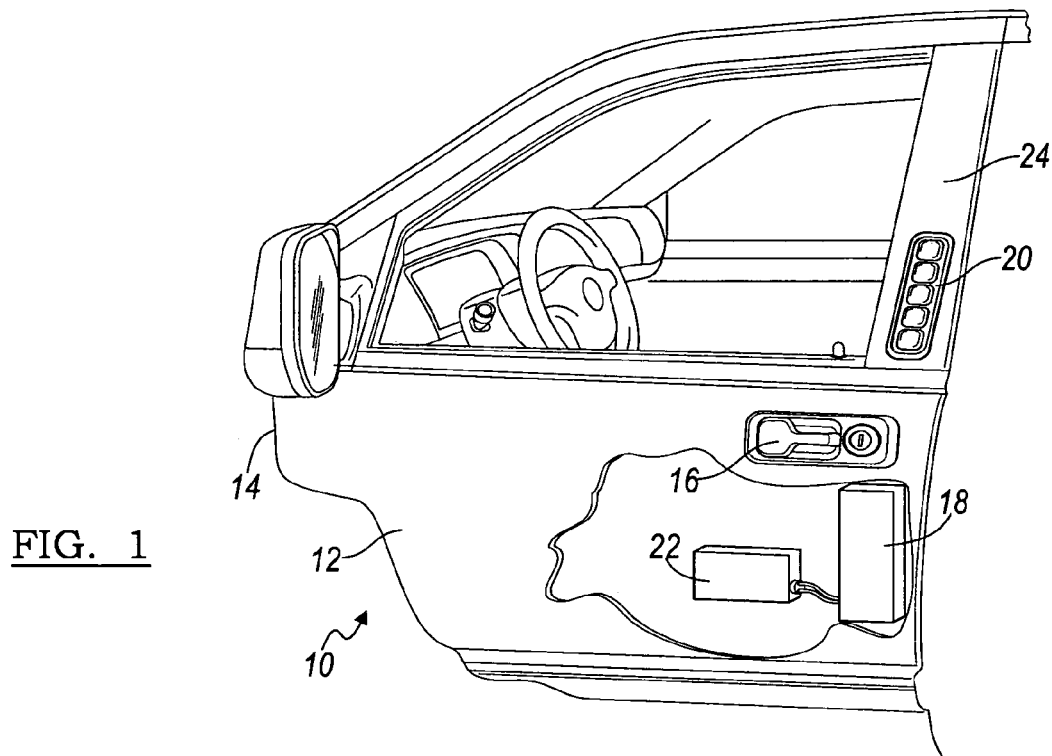
FIG. 1 illustrates a perspective view of a vehicle door including a keyless entry system according to a first preferred embodiment of the present invention.

Referring now to the Drawings and particularly to FIG. 1 there is shown a vehicle 10 illustrating a perspective view of a vehicle door and a keyless entry system in accordance with the present invention. The vehicle 10 includes a vehicle door 12 hinged to a vehicle body 14. The vehicle door includes a door handle 16 for unlatching a latch mechanism (not shown). The vehicle door 12 includes a lock mechanism, shown generally at 18, for securing the vehicle door 12 in a lock mode. When in the lock mode, the lock mechanism 18 prevents the door handle 16 from unlatching the door latch mechanism and entry to the vehicle 10 is thereafter denied via the vehicle door 12. When in the unlock mode, the door handle 16 may be actuated for gaining access via the vehicle door 12.

The lock mechanism 18 may be actuated between a lock position and unlock position by a plurality of devices. One such vehicular control device includes a keyless door entry device 20. The keyless door entry device 20 is electrically connected to an electronic control module 22 for electrically controlling the actuation of the lock mechanism 20. In other embodiments, the keyless door entry device 20 may be directly electrically coupled to the lock mechanism 18 for unlocking and locking the vehicle door 12.

Figure 2:
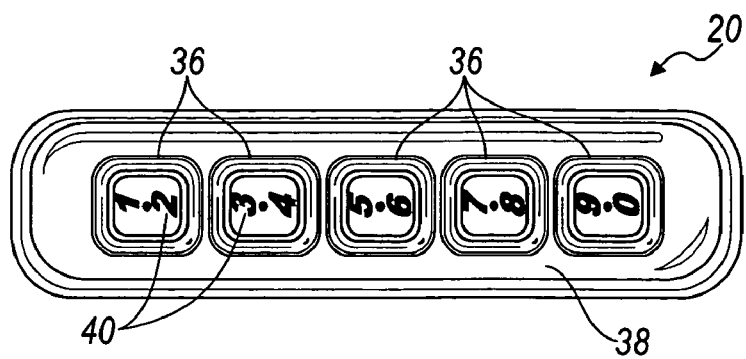
FIG. 2 illustrates a perspective view of a keyless entry keypad device according to a first preferred embodiment of the present invention.

In a preferred embodiment, the keyless entry device 20 is located on a B-pillar 24 of the vehicle 10. In other preferred embodiments, the keyless entry device 20 may be located elsewhere such as on the vehicle door 12 in close proximity to the vehicle door handle 16. The keyless entry device 20, as shown in FIG. 2, includes a sequentially numbered keypad. A plurality of proximity sensors 36 disposed inside of the keyless entry device 20 under a surface of an exterior trim member 38 is directed toward the exterior of the vehicle 10 (shown in FIG. 1) for sensing an object (e.g., finger) in close proximity to the keyless entry device 20. In the preferred embodiment, the plurality of proximity sensors 36 includes capacitance sensors. Capacitance sensors measure the change of capacitance of an area directly in front of and in close proximity to a sensing portion of each capacitance sensor. Each capacitance sensor may be activated without having to actually contact a respective capacitance sensor. Since the plurality of proximity sensors 36 are mounted within the keyless entry device 20 and can sense though the exterior trim number 38, gaps and cut lines typically associated with mechanical switches (buttons) are eliminated. This provides for an aesthetically pleasing appearance of exterior trim member 38 as well as a barrier for preventing moisture and other contaminants. In alternative embodiments, trim member is not limited to the exterior members of the vehicle but may include interior members as well. Furthermore, trim member includes any member in which integrates or structurally supports the control device (e.g., switch).

The plurality of proximity sensors 36 are non-visible and substantially inconspicuous from the exterior of the vehicle 10 so that graphics 40 or other indicators printed along the exterior trim member 38 identify the location of each respective proximity sensor and each respective manual activation region where a user or passenger must locate their finger to actuate the respective proximity sensor. In addition, during poor lighting conditions, lighting schemes are added to illuminate the respective switch or graphic display. The graphics 40 are preferably disposed on the exterior surface of the exterior trim member 38 and are backlit for illuminating the graphics 40 or the area surrounding the graphics 40. For example, if an actual graphic is illuminated, then an area outlining the respective graphic will be opaquely coated so that only the respective graphic is illuminated. Alternatively, if the respective graphic is displayed by illuminating only the background, then the respective graphic is opaquely coated and is seen in silhouette. Furthermore, the graphics 40 may be formed on the interior side of the exterior trim piece 38 or within the exterior trim piece 38 in any manner that allows the graphics 40 to be illuminated and visible from the exterior of the vehicle 10.

Figure 3A:
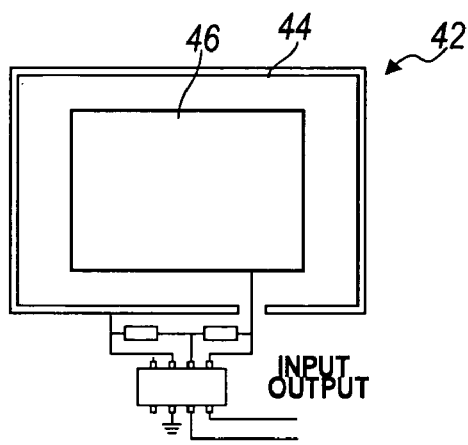
FIGS. 3a and 3b shows a field effect sensor used in the keyless entry device according to a first preferred embodiment of the present invention.
Figure 3B:
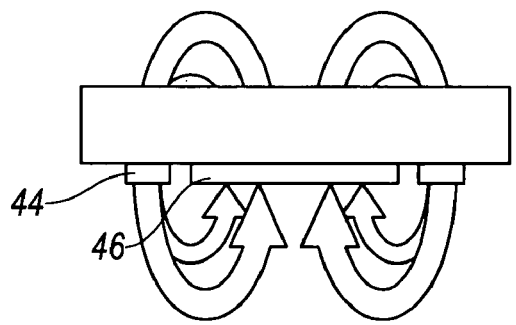

FIG. 3a illustrates a preferred embodiment of a proximity sensor. The proximity sensor as illustrated is a field effect sensor 42 manufactured by Materials Science Corp. The field effect sensor 42 is a low impedance device that utilizes a 5 V input. The field effect sensor 42 includes a first conductive trace 44 and a second conductive trace 46. The two conductive traces emit an electromagnetic field in a manual activation region about the surface of the exterior trim member 38. FIG. 3b illustrates the electromagnetic fields generated about the first conductive trace 44 and the second conductive trace 46 that defines a respective manual activation region. The conductive traces 44 and 46 are measured for a change of capacitance in the manual activation region of each switch. An object placed within the manual activation region changes the electromagnetic field. The sensed change in the electromagnetic field is associated with an operator's request to actuate the vehicle door lock mechanism 20.

Figure 4:
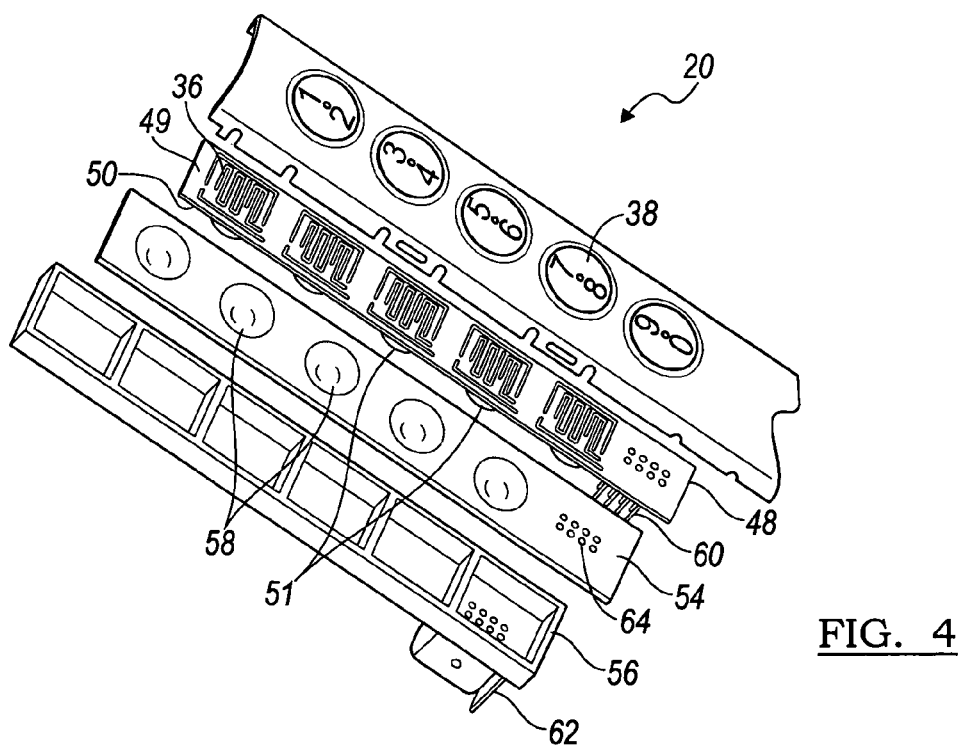
FIG. 4 illustrates an exploded view of the keyless door entry device according to a first preferred embodiment of the present invention.

FIG. 4 illustrates an exploded view of the keyless door entry device 20. The keyless door entry device 20 includes the exterior trim member 38. Preferably, a printed circuit board 48 includes the plurality of proximity sensors 36 disposed on a first side surface 49 for sensing an object on the exterior portion of the exterior trim member 38. Alternatively, the plurality of proximity sensors may be mounted on either side of the printed circuit board or the proximity sensors may be integrated within a middle layer if a flexible-type printed circuit is utilized. Printed circuit board 48 is disposed under the interior portion of the exterior trim member 38. A plurality of illumination elements 51, such as LEDs, are mounted on a second side surface 50 of the printed circuit board 48. A sealing member 54 is disposed below the printed circuit board 48. A back cover 56 is disposed under the sealing member 54 for encasing the printed circuit board 48 within the space between the back cover 56 and the exterior trim number 38. The perimeter of the sealing member 54 is secured between the interconnecting mating surfaces of the back cover 56 and the exterior trim member 38 for making the space therebetween watertight. In the preferred embodiment, the sealing member 54 is a substantially reflective planar member that includes a plurality of indentations 58. For example, the sealing member 54 may include a silicone rubber based material that is white in color giving it both sealing and reflective properties. The plurality of indentations 58 are concave shaped and each respective indentation is positioned over a respective illumination element for reflecting the illuminated light radiated from the plurality of illumination elements 51. The concave shape of the plurality of indentations 58 reflects the illuminated light at various angles back toward the printed circuit board 48.

The term printed circuit board as used herein may include either rigid printed circuit boards or flexible printed circuits. The printed circuit board 48 is semi-translucent for allowing illumination light to pass therethrough. Examples of printed circuit substrates made from a semi-translucent material include, but are not limited to, fiber glass (e.g., FR-4) without additional light stabilization pigments for rigid circuit boards, or clear Mylar for flexible printed circuits. The reflected illumination light is diffused as the illuminating light passes through the printed circuit board 48. The diffused illuminated light backlights the plurality of graphics 40 formed on the exterior trim member 38. The plurality of illumination elements 51 is illuminated when an object is detected by any one of the plurality of proximity sensors 36.

The printed circuit board 48 further includes a plurality of terminal contacts 60 that extend through the back cover 56 and into a connector housing 62. The sealing member 54 includes a plurality of apertures 64 for allowing the plurality of terminal contacts 60 to pass therethrough to the connector housing 62 formed on the back cover 56.

Figure 5:
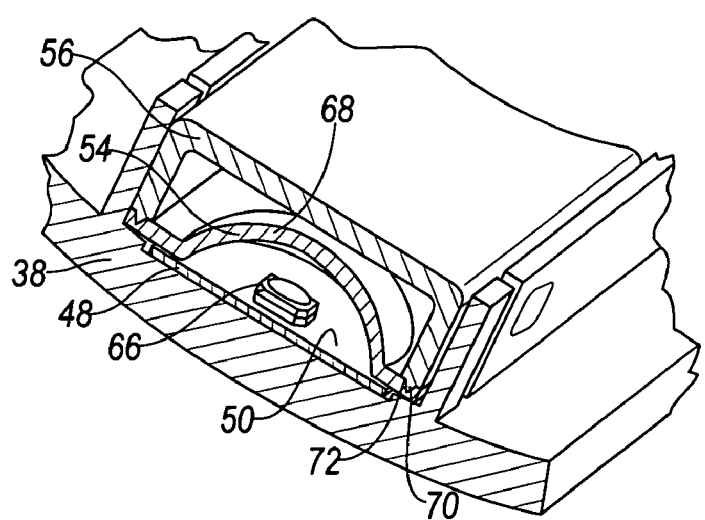
FIG. 5 illustrates a cross-section view of the keyless door entry device according to a first preferred embodiment of the present invention.

FIG. 5 illustrates a cross-section of the keyless door entry device 20 as shown in FIG. 1. Preferably, the printed circuit board 48 is in contact with the exterior trim member 38 and has no air gaps or voids therebetween. Having the printed circuit board 48 in contact with the exterior trim member 38 prevents the electromagnetic field generated by the plurality of proximity sensors 36 from varying due to the manufacturing and assembly process tolerances. As a result, only the exterior trim member 38 thickness tolerance must be maintained to provide a uniform electromagnetic field.

An illumination element 66 as shown is disposed on the second side surface 50 of the printed circuit board 48. When any one of the plurality of proximity sensors 36 (shown in FIG. 4) senses an object in any of the electromagnetic fields, the illumination element 66 including all other illumination elements are illuminated. Illumination light is radiated toward a concave indentation 68. The curvature of the concave indentation 68 reflects the illumination light at various angles toward the printed circuit board 48. This allows illumination light to be radiated and evenly distributed over a greater area of the printed circuit board 48.

The sealing member 54 is fixed in place by pinching the perimeter ends of the sealing member 54 between the exterior trim member 38 and the back cover 56. A rib 70 is formed about the perimeter of an end surface 72 of the exterior trim member 38. When the back cover 56 is press fit into the exterior trim member 38, the rib 70 protrudes into the sealing member 54 thereby preventing the sealing number 54 from disengaging from the interconnection joint between back cover 56 and the exterior trim member 38. As the reflected illumination light passes through the semi-translucent printed circuit board 48, the illumination light diffuses and is directed at the graphics 40.

To actuate the lock mechanism, a respective number of proximity sensors are actuated in a predetermined sequential order as determined by the electronic control module 22 and will actuate the lock mechanism 20 for unlocking and locking the vehicle door 12 if the correct sequence is keyed in by the user.

FIG. 6 illustrates a method for forming the illuminated keyless entry sensing device according to a preferred embodiment of the present invention. In step 80, an exterior trim member is provided having graphics formed thereon. In step 81, a semi-translucent printed circuit board is provided including a plurality of proximity sensors mounted on a first side surface and a plurality of illumination elements mounted on a second side surface of the printed circuit board. As discussed earlier, the plurality of proximity sensors may be mounted on either side of the printed circuit board or the proximity sensors may be integrated within a middle layer if a flexible-type printed circuit is utilized. The plurality of proximity sensors generates electromagnetic fields thereby defining manual activation regions. The plurality of graphics assist a user in identifying each manual activation region. In step 82, a sealing member is provided having reflective properties. In step 83, a back cover is provided that is adaptable to the trim member and forms a space therebetween. In step 84, the printed circuit board and sealing member are assembled within the space formed by the exterior trim member and the back cover. The seal is juxtaposed to the illumination elements for receiving the illuminating light from the illumination elements and reflecting the illuminating light at various angles toward the semi-translucent printed circuit board. The semi-translucent printed circuit board diffuses the reflecting illuminating light therethrough for backlighting the plurality of graphics.

FIG. 7 illustrates a method for operating an illuminating keyless entry device. In step 90, a keyless entry device is provided that includes a semi-translucent printed circuit board having a plurality of proximity sensors mounted on a first side surface of the printed circuit board and a plurality of illumination elements on a second side surface of the printed circuit board. The keyless entry device further includes the exterior trim member having graphics formed thereon. In step 91, an object is disposed in one of the plurality of manual activation regions generated by the plurality of proximity sensors. In step 92, the illuminating light is radiated at the reflective surface within the keyless entry device. The illumination light is reflected by the reflective surface and is diffused through printed circuit board for backlighting the plurality of graphics in step 93. In step 94, the sequential activation of the respective manual activation regions as activated by the user are compared to a predetermined activation sequence for determining whether to actuating the door lock mechanism.

Figure 8A:
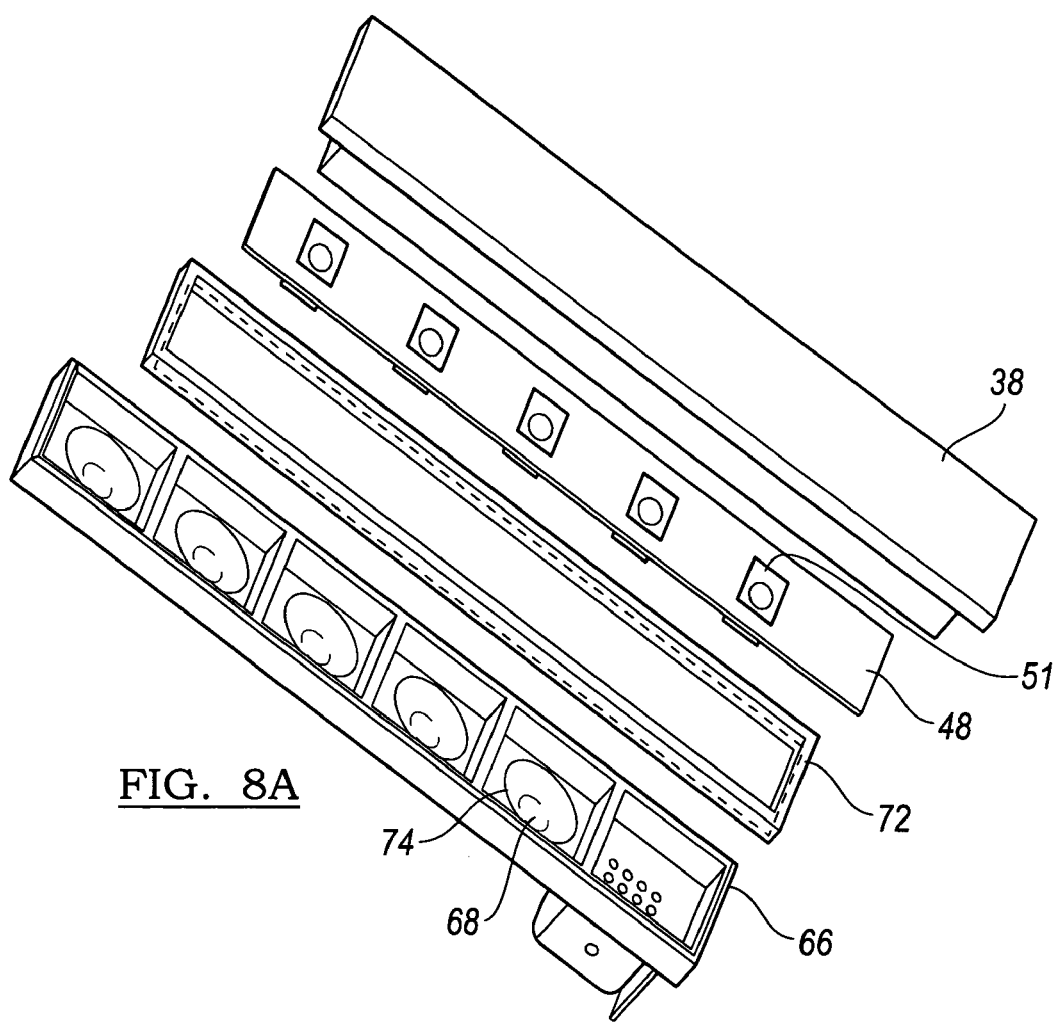
FIGS. 8a and 8b illustrates an exploded view and a cross section view of a keyless door entry device according to a second preferred embodiment of he present invention.
Figure 8B:
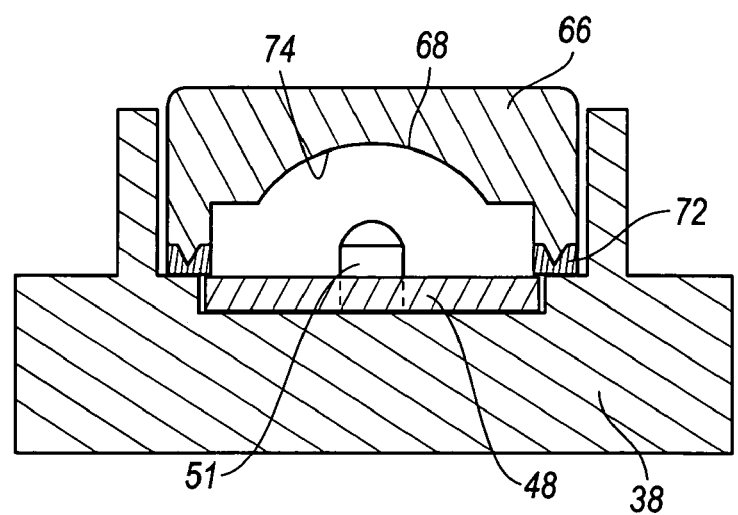

FIGS. 8a and 8b illustrate an exploded view and a cross section view of a keyless entry module according to a second preferred embodiment of the present invention. A sealing member 72 includes a peripheral seal that is disposed about the interconnecting joint between the exterior trim member 38 and a back cover 66. The area within the perimeter of the sealing member 72 is opened to allow illuminating light generated by the illumination elements (not shown) to pass therethrough and radiate against the interior side 74 of the back cover 66. The back cover 66 is a substantially planar member that has reflective properties on its interior side 74. The back cover 66 includes a plurality of indentations 68. The plurality of indentations 58 are concave shaped and each respective indentation is positioned over a respective illumination element for reflecting an illuminated light from the plurality of illumination elements 51. The concave shape of the plurality of indentations 68 reflects the illuminated light at various angles toward the semi-translucent printed circuit board 48 and is diffused therethrough.

From the foregoing description, one ordinarily skilled in the art can easily ascertain the essential characteristics of this invention and, without departing from the spirit and scope thereof, can make various changes and modifications to the invention to adapt it to various usages and conditions. For example, a reflective member other than the sealing member may be inserted for reflecting the illuminating light back towards the printed circuit board. In addition, different sensors such as a piezo-electric sensor or other types of sensors or flex circuits may be utilized. Furthermore, the detailed invention as claimed may be applied to other vehicle based control devices and switches that require both illumination and sealing.

What is claimed is:

1. A vehicular control device comprising:

a trim member having a plurality of graphics for identifying a plurality of manual activation regions;

a printed circuit board having a plurality of proximity sensors wherein each of said plurality of proximity sensors generates a respective electromagnetic field within a respective manual activation region and is responsive to an object disposed in said respective manual activation region, said printed circuit board being semi-translucent and including a plurality of illumination elements for illuminating light away from said printed circuit board;

a back cover member adaptable to said trim member for encasing said printed circuit board therebetween; and a sealing member disposed between said trim member and said back cover member;

wherein said illuminating light from said plurality of illumination elements is reflected toward said printed circuit board, wherein said printed circuit board receives said illuminating light and diffuses said illuminating light therethrough for backlighting said plurality of graphics.

2. The vehicular control device of claim 1 wherein said sealing member is reflective for reflecting said illuminating light.

3. The vehicular control device of claim 2 wherein said sealing member includes a plurality of indentations for reflecting said illuminating light from said printed circuit board.

4. The vehicular control device of claim 3 wherein said plurality of indentations are concave.

5. The vehicular control device of claim 1 wherein said back cover member is reflective for reflecting said illuminating light.

6. The vehicular control device of claim 1 wherein said plurality of illumination elements are responsive to said object disposed in one of said respective manual activation regions for initiating backlighting of said plurality of graphics.

7. The vehicular control device of claim 1 wherein said trim member is a portion of a vehicle door.

8. The vehicular control device of claim 7 wherein said trim member is a portion of a B-pillar.

9. The vehicular control device of claim 1 wherein said printed circuit board includes a control circuit for detecting an activation of said plurality of proximity sensors.

10. A method of forming an illuminated vehicular control device comprising the steps of:

forming a trim member having a plurality of graphics disposed thereon for identifying a plurality of manual activation regions;

forming a back cover member adaptable to said trim member;

disposing a printed circuit board between said trim member and said back cover member, said printed circuit board including a plurality of proximity sensors wherein each of said plurality of proximity sensors generates a respective electromagnetic field within a respective manual activation region and is responsive to an object disposed in said respective manual activation regions, said printed circuit board further including a plurality of illumination elements; and disposing a sealing member between said trim member and said back cover member for sealing said space between said sealing member and said trim member wherein said sealing member is juxtaposed to said illumination elements for reflecting an illuminating light generated by said plurality of illumination elements toward said printed circuit board wherein said printed circuit board is semi-translucent for diffusing said illuminating light therethrough for backlighting said plurality of graphics.

11. The method of claim 10 wherein said light illuminated from said illumination elements is reflected by said sealing member.

12. The method of claim 10 wherein said light illuminated from said illumination elements is reflected by said back cover member.

13. The method of claim 10 wherein said trim member is formed on a portion of a vehicle door.

14. The method of claim 13 wherein said trim member is a portion of a B-pillar.

15. The method of claim 10 wherein said plurality of graphics are illuminated in response to said object disposed in one of said respective manual activation regions.

16. A method of operating a vehicular control device comprising the steps of:

providing a printed circuit board having a plurality of proximity sensors for generating electromagnetic fields within a plurality of manual activation regions wherein each respective proximity sensor is responsive to an object disposed within a respective manual activation region, said printed circuit board further including a plurality of illumination elements directed at a reflective member;

illuminating a plurality of graphics disposed on a trim member in response to sensing said object disposed in at least one manual activation region, said plurality of graphics are illuminated by said illumination elements wherein an illumination light generated from said illumination elements is reflected by a reflective surface and diffused through said printed circuit board having semi-translucent properties.

17. The method of claim 16 further comprising the step of sequentially detecting said object in said plurality of manual activation regions.

18. The method of claim 17 further comprising the step of providing a control action for accessing said vehicle in response to said sequential detection.

* * * * *